United States Patent [19]

Hermeyer

[11] 3,821,552

[45] June 28, 1974

[54] CIRCUIT ARRANGEMENT IN PARTICULAR FOR X-RAY DIAGNOSTIC APPARATUS

[75] Inventor: Bernd Hermeyer, Henstedt-Ulzburg, Germany

[73] Assignee: U.S. Philips Corporation, New York, N.Y.

[22] Filed: Nov. 2, 1972

[21] Appl. No.: 303,247

[30] Foreign Application Priority Data

Nov. 3, 1971 Germany .......................... 2154539

[52] U.S. Cl. .............................. 250/388, 250/416

[51] Int. Cl. ........................................ G01t 1/18

[58] Field of Search .................... 250/374, 388, 416

[56] References Cited

UNITED STATES PATENTS 3,492,483 1/1970 Brandelik et al. ............. 250/416 X 3,634,871 1/1972 Siedband et al. .............. 250/416 X 3,654,468 4/1972 Shah ............................ 250/388 X

*Primary Examiner*—Archie R. Borchelt

*Attorney, Agent, or Firm*—Frank R. Trifari; Bernard Franzblau

[57] ABSTRACT

In an electronic exposure meter for an X-ray diagnostic apparatus use is made of a circuit arrangement comprising digital circuit components. This results in a higher exposure accuracy and avoids incorrect switching as well as the use of inductances and capacitances which are difficult to maintain in practice. An active filter circuit is used as an input band-rejection filter, the said circuit consisting of a band-pass filter and an adding stage which provides automatic offset correction and delay-correction. The adding stage is followed by an interference suppression device and a positively fed back field effect transistor differentiating stage.

9 Claims, 2 Drawing Figures

CIRCUIT ARRANGEMENT IN PARTICULAR FOR X-RAY DIAGNOSTIC APPARATUS

The invention relates to a circuit arrangement for an automatic exposure device which supplies a switch-off pulse as soon as the input signal exceeds an adjustable threshold value and which is connected between measuring chambers which are followed by electrometer amplifiers and a switch-off element and consists of an input band-rejection filter, a comparison stage and a thyristor output stage.

Automatic exposure devices of this kind are known, inter alia from X-ray diagnostic apparatus which is marketed by the applicant and which is improved according to this invention. One of the main problems in this kind of apparatus was the suppression of interference. However, important improvements are also made in the first stages of the above-mentioned circuit arrangement as will be described hereinafter.

The above-mentioned automatic exposure device incorporating the characteristics of the invention will be described for an embodiment of an X-ray diagnostic apparatus, but can in principle also be applied in other fields.

In this embodiment it actually concerns a part of an electric exposure meter. Known measuring chambers followed by electrometer amplifiers supply a signal in accordance with the tube current, i.e. after the X-ray tube has been switched on, which increases approximately in accordance with the shape of a sawtooth. If a predetermined desired value is exceeded, the X-ray tube must be switched off by a so-termed timing switch.

The time is determined in practice by a reference voltage which is dependent on the film material used. Images of good quality require very accurate switching off. Since the switch-off element introduces a delay in switching off, i.e. due to the electronic and mechanical components used, this must also be taken into account for the circuit arrangement which is connected between the electrometer amplifiers and the timing switch and to which is the subject of the invention.

Combined interference had to be taken into account and suppressed such that the accuracy of the exposure was improved with respect to known devices, and incorrect switching, i.e. premature actuation of the timing switch as a consequence of an interference pulse caused by a flash-over in the X-ray tube, had to be avoided with certainty.

This kind of interference suppression is the subject of a copending U.S. application of the Applicant Ser. No. 271,346. The other parts of the known circuit arrangement, however, also required substantial modifications.

First of all, it is known to use an L-C series resonant circuit at the input of the known circuit arrangement as a band-rejection filters, which means that this circuit was connected approximately parallel to the working resistance of the output tube of the corresponding chamber amplifier. So as to obtain a given resonance at the frequencies of 100, 120, 300 and 360 Hz to be adjusted, the circuit quality had to be high. In practice this gave rise to an inductance of, for example, 2 H and higher. The capacitors used were allowed to have only very small tolerances. Furthermore, high long-term constancy was required. All this gave rise to very complex components.

The known comparison stage, connected behind the L-C band-rejection filter, gave rise to other problems. First of all, the interference pulses could also readily pass this filter, but the use of a capacitive coupling of the transistor stage gave rise to false long-term exposures due to the required input current (= base current). This drawback was even more serious in that it was often not noticed, or often only too late.

Consequently, the invention has for its object to provide a circuit arrangement which eliminates the said shortcomings and drawbacks at acceptable cost, i.e. to provide simple and accurate resonance tuning, complete suppression of interference pulses caused by the flash-overs in the tubes and hence prevention of premature switching off while other kinds of interference are suppressed at the same time.

In accordance with the invention this is achieved in that a low-pass filter is arranged in front of the band-rejection filter, the band-rejection filter being constructed as an active filter circuit consisting of a band-pass filter and an adding stage which provides automatic offset correction and delay-correction, the adding stage being connected behind an interference suppression device, and the comparison stage being constructed as a positively feed back field effect transistor differentiating stage.

In accordance with the invention, the lowpass filter can be constructed as an active filter for suppression of the interference signals above 500 Hz.

The active filter circuit can furthermore comprise three operational amplifiers which constitute an analog calculating circuit for simulating the normal oscillatory circuit and which each comprise only one adjusting member for one resonant frequency.

Moreover, the adding stage can be constructed such that the ripple signal which originates from the filter circuit and which is shifted 180° is added to the input signal so as to eliminate the ripple, the offset correction being obtained by suppression of the direct-current component, whereas the delay-correction is provided by an RC-element in a feedback line.

The insertion of the low-pass filter, which allows passage of frequencies of only up to approximately 500 Hz, offers improved suppression of interference which is coupled-in via connection cables etc. The limit frequency of this low-pass filter, however, is chosen to be such that unimpeded passage of steep sawtooth pulses of, for example, 10 V/ms is allowed, whilst all higher interference frequencies are cut off so that they cannot penetrate into the circuit arrangement. The replacement of the LC band rejection filter by an active filter circuit not only offers improved selectivity, but also the adjustment is simplified because now only four readily adjustable adjusting elements are present for the four frequencies.

The adding stage receives the input signal and the 180° phase-shifted "band-rejection filter" output signal, so that the ripple is eliminated and at the same time it produces the delay-correction which is required in view of the delayed switching-off of the timing switch.

The automatic so called offset compensation produces level adaptation for the interference suppression circuit. The interference suppression circuit suppresses the needle pulses which are caused by the flash-overs in the X-ray rube, including the decay oscillations, and prevents the interference signals from penetrating into the comparison stage and hence into the output stage.

The comparison stage according to the invention is constructed as a FET differentiating stage and has only a minimum input current (< 100 pA) so that there can be no false long-term recordings.

The thyristor output stage is only slightly modified and is not covered by this invention.

One embodiment according to the invention is shown in the drawing and will be described in detail hereinafter.

Figure 1:
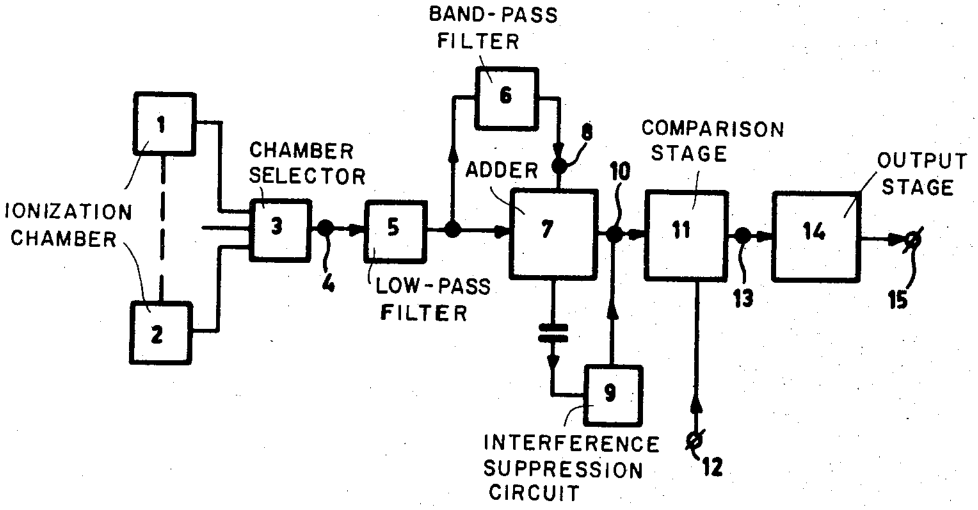
FIG. 1 shows a block diagram of the circuit arrangement.

The reference numerals 1 and 2 in the block diagram of FIG. 1 denote two of a plurality of ionisation measuring chambers which are arranged in the beam path to be measured of an X-ray tube. The electrometer amplifiers, which are connected behind these chambers 1 and 2, are connected to the circuit arrangement according to the invention via a chamber selector 3 which is automatically connected to the individual chambers 1 and 2. The input signal is thus applied to the circuit arrangement at circuit point 4 and proceeds in the direction of the arrow. The input signal first passes the low-pass filter 5, the limit frequency of which is chosen so that the steepest amplitude of the chamber signal, which can amount to, for example, 1 ms, is still allowed to pass without being affected. All higher interference frequencies are cut off. The output signal of the low-pass filter is subsequently applied to the input of a band-pass filter 6 as well as to an adding stage 7 which performs the automatic offset correction and provides the above-mentioned delay-correction which can be as high as 3 ms. The band-pass filter 6 is adjusted to the relevant ripple frequency of the high voltage, for example, to 100 or 300 Hz for a 50 Hz supply or 120 or 360 Hz for a 60 Hz supply.

Only these adjusted frequencies can pass the band-pass filter 6 and depart from this filter at circuit point 8 after having been phase-shifted 180°. They are subsequently added to the signal to be measured in the adding stage 7 so that the ripple on the input signal is eliminated. The signal then proceeds via the interference suppression device 9 to the circuit point 10 and via the latter directly to the comparison stage 11, to which the reference voltage, i.e. the so-termed blacking voltage which is dependent of the chosen film material, is applied from circuit point 12.

From the comparison stage 11 the signal is finally applied, via the circuit point 13, to the thyristor output stage 14 and appears as the output signal at circuit point 15.

Further details of the invention will be described with reference to the circuit arrangement shown in FIG. 2.

As already stated, first to be eliminated is the interference which penetrates into the measuring leads and which can be clearly distinguished from the interference pulse which is caused by the tube flash-overs in view of its frequency and also its amplitude.

At the circuit point 4 (see FIG. 1) the input signal is applied to a low-pass filter which is composed of an operational amplifier $B_1$, the resistors $R_1$ to $R_3$, and the capacitors $C_1$, $C_2$. The resistances and capacitances of this amplifier are such that the amplifier has the characteristic of a Bessel filter.

Present at the output 16 of the low-pass filter is the inverted input signal which no longer contains high-frequency interference. This signal is applied to a band-pass filter consisting of the operational amplifiers $B_2$, $B_3$, $B_4$, the resistors $R_4$ to $R_{15}$ and the capacitors $C_4$ and $C_6$, and also to an adding stage.

The band-pass filter represents an analog calculating circuit which simulates the normal oscillation equation. This circuit arrangement has the advantage that only one potentiometer is required for the adjustment of the resonant frequency.

The filtered output signal leaves the bandpass filter at point 8 after having been phase-shifted 180° and is added to the original signal in an adding stage consisting of $B_5$, $B_6$, $B_7$, $R_{18}$ to $R_{30}$, $C_{11}$, $C_{12}$. This adding stage is provided with automatic offset correction ($R_{20}$ to $R_{23}$, $C_{11}$ and switch 2) and an RC-element ($C_{12}$, $R_{28}$) in the feedback line, which supplies the required delay-correction of, for example, 3 ms.

The offset correction is as follows: switch 2 is closed between X-ray exposures. The same input voltage is then present on both gate inputs of the operational amplifier. As a result of the severe direct-current component suppression of the amplifier, the output remains approximately at O V in the case of an alternating input signal and a closed contact (switch 2). During the X-ray exposure, switch 2 is opened and the voltage value is stored in $C_{11}$. A variation of the input signal now acts only on the inputs $R_{18}$, $R_{19}$ and drives the amplifier to full output.

Via $R_{33}$, the output signal is applied to the actual comparison stage, consisting of the active elements $B_9$, $B_{10}$, $B_{15}$, $B_{16}$. Any interference peaks present are eliminated via $C_{14}$ by an interference suppression circuit. This circuit is composed of the components $B_8$, $B_{12}$, $B_{13}$, $B_{14}$, $R_{32}$, $R_{34}$, $R_{50} - R_{54}$ and $C_{15}$, $C_{25}$. The current across $C_{15}$ amounts to $I = C_5 \times du/dt$ and causes a voltage drop amounting to $$U_{R_{52}} = C_{15} \times R_{52} \times \frac{du}{dt}$$

on $R_{52}$. If this voltage exceeds the threshold voltage of $B_{12}$, the latter becomes conducting. As a result, $B_{13}$ and $B_{14}$ also become conducting, $B_{14}$ short circuits the input of the comparison stage for the duration of the interference. After disappearance of the interference, $B_{14}$ remains conducting approximately 1 ms longer as a result of the time constant $R_{54}//R_{55} \times C_{25}$ in order to catch any further decay oscillations, and to keep these removed from the input of the comparison stage.

In the comparison stage a desired voltage (U desired) which reaches gate 2 via $R_{19}$, $R_{42}$ is compared with the actual voltage from the adding stage (point 10). This comparison stage consists of a field effect differentiating input stage and 2 transistor stages $B_9$, $B_{15}$ which produce a positive feedback. $B_{16}$ operates as a constant current system for the input stage. If $U_{actual} < U_{desired}$, the voltage drop on $R_{38}$ is smaller than the actuation voltage of the transistor $B_9$. If $U_{actual} = U_{desired}$, $B_9$ becomes conducting and hence $B_{15}$. As a result, the desired voltage is reduced by the factor of the resistance ratio $(R_{49} + R_{42})R_{41}$, which has the same effect as a positive feedback and which causes fast switching over of the stage. $C_{18}$, $C_{27}$ and $C_{16}$ are additional interference-suppression capacitors.

The pulse edge in reaction to which switching off takes place is differentiated via $C_{19}$, $R_{40}$, drives $B_{17}$ to conduction and thus ignites the thyristor $G_7$. The latter discharges $C_{22}$ and thus produces a switch-off pulse, via $T_1$, on the outputs 15.

Figure 2:
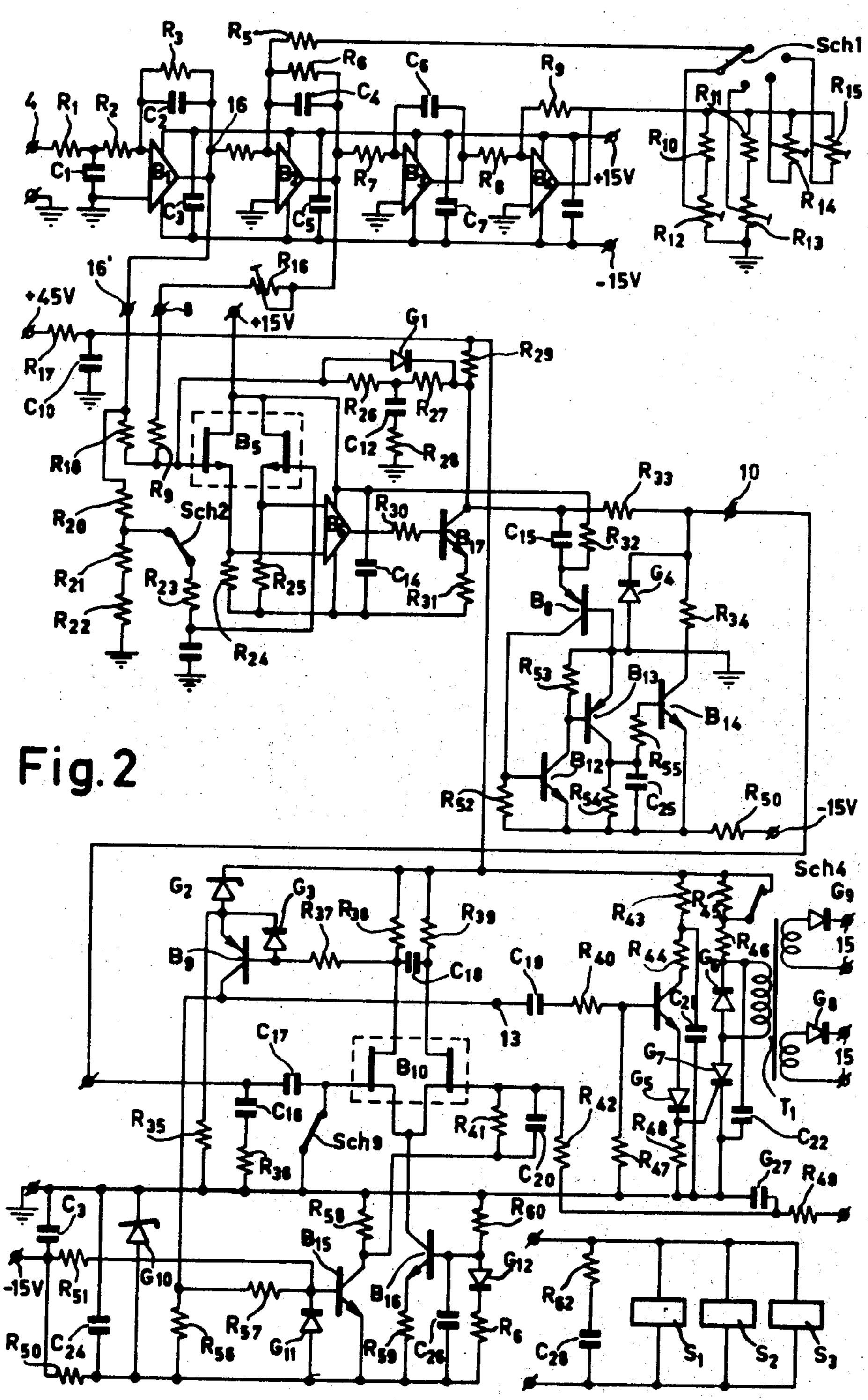
FIG. 2 shows the lay-out of the circuit arrangement with the most important components.

A circuit arrangement according to FIG. 2 which was calculated by way of example, was composed of the following circuit components which are stated together with their values:

| | | | | | |
|---|---|---|---|---|---|
| R1 = | 27 | KΩ | R13 = | 5 | K |
| R2 = | 27 | do. | R14 = | 2 | do. |
| R3 = | 18 | do. | R15 = | 2 | do. |
| R4 = | 12 | do. | R16 = | 20 | do. |
| R5 = | 82 | Ω | R17 = | 100 | Ω |
| R6 = | 18 | KΩ | R18 = | 18 | KΩ |
| R7 = | 4 | do. | R19 = | 20 | do. |
| R8 = | 12 | do. | R20 = | 18 | do. |
| R9 = | 12 | do. | R21 = | 27 | do. |
| R10 = | 8 | do. | R22 = | 27 | do. |
| R11 = | 5.6 | do. | R23 = | 100 | do. |
| R12 = | 5 | do. | R24 = | 150 | do. |
| R25 = | 150 | K | R44 = | 330 | Ω |
| R26 = | 27 | do. | R45 = | 1 | MΩ |
| R27 = | 27 | do. | R46 = | 4 | KΩ |
| R28 = | 2 | do. | R47 = | 22 | do. |
| R29 = | 5.6 | do. | R48 = | 33 | Ω |
| R30 = | 33 | do. | R49 = | 1 | KΩ |
| R31 = | 1 | do. | R50 = | 22C | Ω |
| R32 = | 39 | KΩ | R51 = | 27 | KΩ |
| R33 = | 4.7 | do. | R52 = | 1 | do. |
| R34 = | 560 | Ω | R53 = | 4.7 | do. |
| R35 = | 4.7 | KΩ | R54 = | 10 | do. |
| R36 = | 33 | Ω | R55 = | 10 | do. |
| R37 = | 4.7 | KΩ | R56 = | 22 | do. |
| R38 = | 47 | KΩ | R57 = | 12 | do. |
| R39 = | 47 | do. | R58 = | 4.7 | do. |
| R40 = | 22 | do. | R59 = | 2.7 | do. |
| R41 = | 2.7 | MΩ | R60 = | 10 | do. |
| R42 = | 27 | KΩ | R61 = | 2.7 | do. |
| R43 = | 15 | do. | R62 = | 100 | Ω |
| C1 = | 15 | nF | C9 = | 47 | μF |
| C2 = | 15 | nF | C10 = | 47 | μF |
| C3 = | 0.1 | μF | C11 = | 1 | μF |
| C4 = | 0.47 | μF | C12 = | 0.3 | μF |
| C5 = | 0.1 | μF | C14 = | 0.1 | μF |
| C6 = | 0.1 | μF | C15 = | 22 | nF |
| C7 = | 0.1 | μF | C16 = | 10 | nF |
| C8 = | 0.1 | μF | C17 = | 1 | μF |
| C18 = | 1 | nF | C24 = | 100 | μF |
| C19 = | 10 | nF | C25 = | 47 | nF |
| C20 = | 1 | nF | C26 = | 1 | μF |
| C21 = | 1 | μF | C27 = | 1 | μF |
| C22 = | 0.68 | μF | C28 = | 0.1 | μF |
| C23 = | 47 | μF | | | |
| B1 = | TBA 221 | | B9 = | BC 157 | |
| B2 = | TBA 221 | | B10 = | U 235 | |
| B3 = | TBA 221 | | B11 = | BC 147 | |
| B4 = | TBA 221 | | B12 = | BC 147 | |
| B5 = | U 235 | | B13 = | BC 157 | |
| B6 = | TBA 221 | | B14 = | BC 147 | |
| B7 = | BC 147 | | B15 = | BC 147 | |
| B8 = | BC 157 | | B16 = | BC 147 | |
| G1 = | BAX 13 | | G7 = | BT 100A 300R | |
| G2 = | BZX 79 C6V8 | | G8 = | BAX 12 | |
| G3 = | BAX 13 | | G9 = | BAX 12 | |
| G4 = | BAX 13 | | G10 = | BAX 79 C5V6 | |
| G5 = | BAX 13 | | G11 = | BAX 13 | |
| G6 = | BAX 12 | | G12 = | BAX 13 | |

What is claimed is:

1. A signal processing circuit for an automatic exposure device that includes a radiation detector coupled to an electrotransmitter amplifier and including means for suppressing interference signals comprising, a low pass filter adapted to receive the signal to be processed and any interference signals that occur, a band-pass filter constructed as an active filter circuit with its input coupled to the output of the low pass filter, an adding stage with means for providing automatic offset correction and delay correction, means for coupling the output of the low pass filter and the band-pass filter output to the input circuit of said adding stage, a comparison stage including a positive feedback field effect transistor differentiating circuit with one input coupled to a source of reference voltage and a second input coupled to the output of the adding stage, interference suppression means having an output coupled to the input of the comparison stage and an input coupled to the output of the adding stage and responsive to interference signals appearing thereat to become operative to effectively block said interference signals from affecting the comparison stage, and an output stage coupled to the output of the comparison stage for deriving an output signal for terminating an exposure period.

2. A circuit for an automatic exposure device as claimed in claim 1, characterized in that the low-pass filter is constructed as an active filter for the suppression of interference signals above 500 Hz.

3. A circuit for an automatic exposure device as claimed in claim 1, characterized in that the active filter circuit of the band-pass filter comprises three operational amplifiers in cascade which represent an analog calculating circuit for simulating the normal oscillatory circuit, each amplifier comprising only one adjusting member for one resonant frequency.

4. A circuit for an automatic exposure device as claimed in claim 1, characterized in that a ripple signal which is supplied to the band-pass filter circuit is phase-shifted 180° and is supplied to the adding stage to be added to the input signal so as to eliminate any ripple in the input signal, the offset correction being achieved by means for the suppression of the direct current component and the delay-correction being produced by an RC element connected in a feedback line of the adding stage.

5. A radiation detection system comprising, a radiation detector responsive to the radiation for deriving an electric signal determined thereby, a low pass filter, means for coupling an amplified version of said electric signal to the input of the low pass filter, signal adding means, a band-pass filter with an input connected to the output of the low pass filter and an output coupled to the input circuit of the adding means, said band-pass filter including means for providing a 180° phase-shift for given signals passing therethrough, means for coupling the signal at the output of the low pass filter to said input circuit of the adding means, a comparison stage including a positive feedback field effect transistor differentiating circuit with an input coupled to the output of the adding means and an output for supplying a control signal to control the operating period of the system, and electric interference suppression means coupled to the output of the adding means and to the input of the comparison stage and operative in response to an interference signal at the output of the adding means to effectively suppress said interference signal from affecting the input of the comparison stage.

6. A system as claimed in claim 5 wherein said adding means further comprises, amplifier means including means for providing offset correction and an RC circuit connected to a feedback circuit of the amplifier means to provide relay-correction.

7. A system as claimed in claim 5 wherein said band-pass filter comprises an active filter circuit that includes an operational amplifier arranged to simulate the normal resonant circuit.

8. A system as claimed in claim 5 further comprising an AC supply for the system and wherein said bandpass filter comprises an active filter circuit that includes an operational amplifier and tuned to a harmonic of the AC supply frequency.

9. A system as claimed in claim 5 wherein said interference suppression means comprises a switching circuit in shunt with the input of the comparison stage for shunting interference signals away from the input of the comparison stage.

* * * * *

PO-1050 (5/69)

UNITED STATES PATENT OFFICE
CERTIFICATE OF CORRECTION

Patent No. 3,821,552 Dated June 28, 1974

Inventor(s) BERND HERMEYER

It is certified that error appears in the above-identified patent and that said Letters Patent are hereby corrected as shown below:

ON THE TITLE PAGE below "Foreign Application Priority Data" cancel "2154539"

and insert -- P.2154539.1 --;

col. 1, line 32, cancel "termed" and insert -- called --;

col. 2, line 30, after "The" insert -- band-pass --;

line 43, after "frequencies" cancel "of";

line 46, cancel "to be";

col. 3, line 49, cancel "termed" and insert -- called --;

col. 4, line 37, change "$C_{14}$" to -- $C_{15}$ --;

line 39, change "$R_{54}$" to -- $R_{55}$ --;

line 40, change "$C_5$" to -- $C_{15}$ --;

line 44, cancel "on" and insert -- across --;

line 46, cancel the comma (,) and insert -- and --;

line 54, change "$R_{19}$" to -- $R_{49}$ --;

line 57, after "stage" insert -- $B_{10}$--;

line 65, cancel "over";

PO-1050
(5/69)

UNITED STATES PATENT OFFICE
CERTIFICATE OF CORRECTION

Patent No. 3,821,552 Dated June 28, 1974

Inventor(s) BERND HERMEYER

It is certified that error appears in the above-identified patent and that said Letters Patent are hereby corrected as shown below:

IN THE CLAIMS col. 5, line 60, change "electrotransmitter" to -- electrometer --;

col. 6, line 63, cancel "relay-" and insert -- delay --;

col. 7, line 4, cancel "and";

Signed and sealed this 11th day of March 1975.

(SEAL)
Attest:

RUTH C. MASON
Attesting Officer

C. MARSHALL DANN
Commissioner of Patents
and Trademarks